United States Patent
Clark

(10) Patent No.: US 8,440,520 B2
(45) Date of Patent: May 14, 2013

(54) DIFFUSED CAP LAYERS FOR MODIFYING HIGH-K GATE DIELECTRICS AND INTERFACE LAYERS

(75) Inventor: Robert D Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/215,431

(22) Filed: Aug. 23, 2011

(65) Prior Publication Data

US 2013/0052814 A1 Feb. 28, 2013

(51) Int. Cl.
*H01L 21/8238* (2006.01)

(52) U.S. Cl.
USPC .................... 438/199; 257/E27.046

(58) Field of Classification Search .................. 438/591, 438/199; 257/E27.046, E27.108
See application file for complete search history.

(56) References Cited

U.S. PATENT DOCUMENTS

| | | | |
|---|---|---|---|
| 6,407,435 B1 | 6/2002 | Ma et al. | |
| 6,617,639 B1 | 9/2003 | Wang et al. | |
| 6,642,131 B2 | 11/2003 | Harada | |
| 7,091,568 B2 | 8/2006 | Hegde et al. | |
| 7,176,531 B1* | 2/2007 | Xiang et al. | 257/369 |
| 7,446,380 B2 | 11/2008 | Bojarczuk et al. | |
| 7,772,073 B2 | 8/2010 | Clark et al. | |
| 7,888,195 B2 | 2/2011 | Lin et al. | |
| 7,952,118 B2* | 5/2011 | Jung et al. | 257/206 |
| 8,012,827 B2 | 9/2011 | Yu et al. | |
| 8,202,773 B2* | 6/2012 | Niimi et al. | 438/199 |
| 2002/0047170 A1 | 4/2002 | Ota | |
| 2002/0172768 A1 | 11/2002 | Endo et al. | |
| 2003/0052374 A1 | 3/2003 | Lee et al. | |
| 2005/0098839 A1* | 5/2005 | Lee et al. | 257/410 |
| 2005/0245016 A1* | 11/2005 | Pan et al. | 438/199 |
| 2006/0054943 A1 | 3/2006 | Li et al. | |
| 2006/0118890 A1* | 6/2006 | Li | 257/410 |
| 2006/0151823 A1 | 7/2006 | Govindarajan | |
| 2006/0189154 A1 | 8/2006 | Ahn et al. | |
| 2006/0289948 A1 | 12/2006 | Brown et al. | |
| 2007/0178634 A1* | 8/2007 | Jung et al. | 438/199 |
| 2007/0237697 A1 | 10/2007 | Clark | |
| 2008/0081113 A1 | 4/2008 | Clark | |
| 2009/0047798 A1 | 2/2009 | Clark et al. | |

(Continued)

OTHER PUBLICATIONS

Xinyuan Zhao, et al., "First-Principles Study of Electronic and Dielectric Properties of ZrO2 and HfO2", Mat. Res. Soc. Symp. Proc. vol. 745 .COPYRGT. 2003 Materials Research Society, pp. 283-289.

(Continued)

*Primary Examiner* — Thao P. Le

(57) ABSTRACT

Method of forming a semiconductor device includes providing a substrate with defined NMOS and PMOS device regions and an interface layer on the NMOS and PMOS device regions, depositing a high-k film on the interface layer, depositing a first cap layer on the high-k film, and removing the first cap layer from the high-k film in the PMOS device region. The method further includes depositing a second cap layer on the first cap layer in the NMOS device region and on the high-k film in the PMOS device region, performing a heat-treating process to diffuse a first chemical element into the high-k film in the NMOS device region and to reduce or eliminate the interface layer by oxygen diffusion from the interface layer into the second cap layer, removing the first and second cap layers from the high-k film, and depositing a gate electrode film over the high-k film.

20 Claims, 8 Drawing Sheets

U.S. PATENT DOCUMENTS

| | | |
|---|---|---|
| 2009/0108294 A1 | 4/2009 | Choi et al. |
| 2009/0152650 A1* | 6/2009 | Chudzik et al. ............... 257/410 |
| 2010/0127336 A1 | 5/2010 | Chambers et al. |
| 2010/0197128 A1 | 8/2010 | Schaeffer et al. |
| 2010/0258878 A1 | 10/2010 | Mise et al. |
| 2010/0320547 A1 | 12/2010 | Ando et al. |
| 2010/0327373 A1 | 12/2010 | Carter et al. |
| 2011/0127616 A1 | 6/2011 | Hoentschel et al. |
| 2012/0119204 A1 | 5/2012 | Wong et al. |

OTHER PUBLICATIONS

Kamimuta et al., "Systematic Study of Vfb Shift in Stacked High-k Bi-layers with Cycle-by-Cycle ALD" Presentation at the ALD 2007 Conference, Jun. 27, 2007 (18 pp).

R. I. Hegde, et al., "Microstructure Modified HfO2 Using Zr Addition With TaxCy Gate for Improved Device Performance and Reliability", IEEE, 2005, (4 pages).

C. Zhao, et al., "Crystallization and Tetragonal-Monoclinic Transformation in ZrO2 and HfO2 Dielectric Thin Films", Key Engineering Materials vols. 206-213 (2002), pp. 1285-1288.

Y. Kuo, et al., "Sub 2 NM Thick Zirconium Doped Hafnium Oxide High-K Gate Dielectrics", ECS Transactions, The Electrochemical Society, 2006, pp. 447-454.

Kyoung-Ryul Yoon, et al., "Performance and Reliability of MIM (Metal-Insulator-Metal Capacitors With ZrO2 for 50nm DRAM Application", Extended Abstracts of the 2005 International Conference on Solid State Devices and Materials, Kobe, 2005, pp. 188-189.

Hyoungsub Kim, et al., "Comparative Study on Electrical and Microstructural Characteristics of ZrO2 and HfO2 Grown by Atomic Layer Deposition", J. Mater. Res., vol. 20, No. 11, Nov. 2005, .COPYRGT. Material Research Society, pp. 3125-3132.

Y. Kuo, et al., "Sub 2 nm Thick Zirconium Doped Hafnium Oxide High-K Gate Dielectrics", 208th ECS Meeting (Oct. 19, 2005), Abstract #548, 1 page.

Tsunehiro Ino, et al., "Dielectric Constant Behavior of Oriented Tetragonal Zr-Si-O System", Extended Abstracts of the 2006 International Conference on Solid State Devices and Materials, Yokohama 2006, pp. 404-405.

Xinyuan Zhao,let al., "Phonons and Lattice Dielectric Properties of Zirconia", Physical Review B. vol. 65 (2002), pp 075105-1-075105-10.

G. M. M Rignanese, et al., "First-Principles Investigation of High-K Dielectrics: Comparison Between the Silicates and Oxides of Hafnium and Zirconium", Physical Review B 69, 2004, pp. 184301-1-184301-10.

H.Y.Yu, et al., "Physical and Electrical Characteristics of HfN Gate Electrode for Advanced MOS Devices", IEEE Electron Device Letters, vol. 24, No. 4, Apr. 2003, pp. 230-232.

Kamimuta et al., "Systematic Study of Vfb Shift in Stacked High-k Bi-layers with Cycle-by-Cycle ALD", Abstract, 7th International Conference on Atomic Layer Deposition, Jun. 24-27, 2007, San Diego, CA (1 pp).

U.S. Appl. No. 13/363,765, filed Feb. 1, 2012.

U.S. Appl. No. 13/436,552, filed Mar. 30, 2012.

U.S. Appl. No. 13/656,537, filed Oct. 19, 2012.

Choi et al. "Scaling equivalent oxide thickness with flat band voltage (Vfb) modulation using in situ Ti and Hf interposed in a metal/high-k gate stack," Journal of Applied Physics 108 (2010) pp. 064107-1-064107-4.

Ando et al. "Ultimate EOT Scaling (<5A) Using Hf-based High-k Gate Dielectrics and Impact on Carrier Mobility," ECS Transactions 28(1) (2010) pp. 115-123.

* cited by examiner

DIFFUSED CAP LAYERS FOR MODIFYING HIGH-K GATE DIELECTRICS AND INTERFACE LAYERS

FIELD OF INVENTION

The present invention relates to semiconductor devices, and more particularly to a gate stack having a gate electrode over a high-k gate dielectric, and methods of manufacturing the same.

BACKGROUND OF THE INVENTION

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional metal-oxide-semiconductor (MOS) transistor exacerbates problems of polysilicon gate depletion, high gate resistance, high gate tunneling leakage current and device (i.e., boron) penetration into the channel region of the device. As a result, CMOS technology is increasingly replacing silicon dioxide gate dielectrics and polysilicon gate conductors with high dielectric constant (high-k) gate dielectrics in combination with metal gate electrodes formed from a gate stack of polysilicon and one or more metal layers.

Scaling of the gate dielectric is a challenge in improving performance of advanced field effect transistors. A high-k gate dielectric provides a way of scaling down the effective oxide thickness (EOT) of the gate dielectric without an excessive increase in the gate leakage current. However, high-k gate dielectric materials are prone to catalyze oxidation of the underlying substrate because high-k gate dielectric materials react with oxygen that diffuses through the gate electrode or gate spacers. Regrowth of a silicon oxide interface layer between a silicon substrate and the high-k gate dielectric during high-temperature processing steps is a major obstacle to successful effective oxide thickness scaling. Particularly, typical stacks of a high-k gate dielectric and a metal gate are known to be susceptible to a high temperature anneal in an oxygen ambient. Such a high temperature anneal in oxygen ambient results in regrowth of the silicon oxide interface layer and produces instability of the threshold voltage and EOT of field effect transistors.

While high-k dielectrics in conjunction with low sheet resistance metal gate electrodes advantageously exhibit improved transistor performance, the use of new metal layer technologies can create new technical challenges. For example, to optimize drain current and device performance and reduce the voltage threshold Vt, the desired effective work function for negative channel metal-oxide-semiconductor (NMOS) and positive channel metal-oxide-semiconductor (PMOS)) gate electrodes must be near the conduction (or valence) band edge of silicon, meaning that the metals used in NMOS transistors should have effective work functions near 4.1 eV and metals used in PMOS transistors should have effective work functions near 5.2 eV. Since it is difficult to find a material that can have its work function adjusted once it is deposited, approaches for obtaining differentiated work functions have involved forming separate gate electrode layers, such as by removing a deposited first metal gate layer from the gate insulator to deposit a second metal gate layer having a different work function. Such processes can damage the gate insulator layer, leading to high leakage or reliability problems for the finally formed device. Another method for obtaining different work functions involves formation of two gate stacks of unbalanced height which can be a major challenge for the subsequent gate etch process.

Accordingly, a need exists for an improved integration of a metal gate electrode and very thin high-k gate dielectric materials in NMOS and PMOS devices having work functions that are set near the silicon band edges for low voltage thresholds and improved device performance. Further, the integration should reduce or eliminate any interface layer underneath the high-k gate dielectric to enable effective oxide thickness scaling.

SUMMARY OF THE INVENTION

A method is provided for forming a semiconductor device. According to one embodiment of the invention, the method includes providing a substrate with defined NMOS and PMOS device regions and an interface layer on the NMOS and PMOS device regions, depositing a high-k film on the interface layer, and depositing a first cap layer on the high-k film, where the first cap layer contains a first chemical element for modifying the high-k film in the NMOS device region. The method further includes removing the first cap layer from the high-k film in the PMOS device region, depositing a second cap layer on the first cap layer in the NMOS device region and on the high-k film in the PMOS device region, where the second cap layer contains a second chemical element for scavenging oxygen from the interface layer. The method still further includes performing a heat-treating process to diffuse the first chemical element into the high-k film in the NMOS device region and to reduce or eliminate the interface layer by oxygen diffusion from the interface layer through the high-k film into the second cap layer, removing the first and second cap layers from the high-k film, and depositing a gate electrode film over the high-k film.

According to another embodiment of the invention, the method includes providing a substrate with defined NMOS and PMOS device regions, and an interface layer on the NMOS and PMOS device regions, depositing a high-k film on the interface layer, and depositing a first cap layer on the high-k film, wherein the first cap layer contains a first chemical element for scavenging oxygen from the interface layer. The method further includes removing the first cap layer from the high-k film in the NMOS device region, depositing a second cap layer on the first cap layer in the PMOS device region and on the high-k film in the NMOS device region, where the second cap layer contains a second chemical element for modifying the high-k film in the NMOS device region. The method still further includes performing a heat-treating process to diffuse the second chemical element into the high-k film in the NMOS device region and to reduce or eliminate the interface layer by oxygen diffusion from the interface layer through the high-k film into the second cap layer, removing the first and second cap layers from the high-k film, and depositing a gate electrode film over the high-k film.

DETAILED DESCRIPTION OF SEVERAL EMBODIMENTS

Embodiments of the invention describe a gate stack having a gate electrode film over a high-k film, and methods of manufacturing the same. In particular, a semiconductor device and a method for forming NMOS and PMOS transistors are disclosed in various embodiments, where the method combines an ultra-thin or zero thickness interface layer, a high-k film diffused with chemical elements that shift the threshold voltage that is appropriate for the NMOS, PMOS, or both NMOS and PMOS device regions, and a gate electrode on the high-k film. According to embodiments of the invention, first and second cap layers are formed on the high-k film over NMOS and PMOS device regions to provide chemical elements that can diffuse into the NMOS device regions, into the PMOS device regions, or into both the NMOS and PMOS device regions during a heat-treating process. The heat-treating process further reduces the thickness or eliminates an interface layer (e.g., $SiO_2$) underneath the high-k film by oxygen scavenging by the second cap layer. After the heat-treating, the first and second cap layers are removed to expose the high-k film, and a gate electrode film (e.g., TiN) may be deposited over the NMOS and PMOS device regions. Thereafter, conventional gate first or gate last processing may be performed.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not drawn to scale.

Reference throughout this specification to "one embodiment" means that a particular feature, structure, material, or characteristic described in connection with the embodiment is included in at least one embodiment of the invention, but does not denote that it is present in every embodiment. Thus, the appearances of the phrase "in one embodiment" in various places throughout this specification is not necessarily referring to the same embodiment of the invention.

Figure 1A:
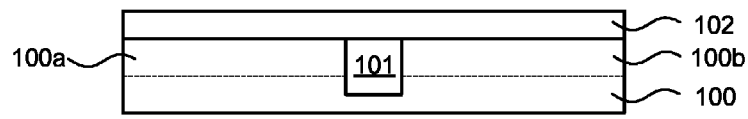
FIGS. 1A-1H show schematic cross-sectional views of a process flow for a gate integration scheme according to an embodiment of the invention.

FIGS. 1A-1H show schematic cross-sectional views of a process flow for a gate integration scheme according to an embodiment of the invention. FIG. 1A schematically shows a substrate 100 containing a NMOS device region 100a and a PMOS device region 100b that are separated by a shallow trench isolation (STI) 101. Depending on the type of device being fabricated, the substrate 100 and the regions 100a/100b may contain bulk silicon substrate, single crystal silicon (doped or undoped), semiconductor on insulator (SOI) substrate, or any other semiconductor material including, for example, Si, SiC, SiGe, SiGeC, Ge, GaAs, InAs, InP, as well as other III/V or II/VI compound semiconductors or any combinations thereof. The substrate 100 can be of any size, for example a 200 mm substrate, a 300 mm substrate, or an even larger substrate. In one example, the substrate 100 can include a tensile-strained Si layer. According to another embodiment, the substrate 100 may contain Ge or $Si_xGe_{1-x}$ compounds, where x is the atomic fraction of Si, 1-x is the atomic fraction of Ge, and $0<1-x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can contain a compressive-strained Ge layer or a tensile-strained $Si_xGe_{1-x}$ (x>0.5) deposited on a relaxed $Si_{0.5}Ge_{0.5}$ buffer layer. In one example, the substrate 100 includes Si and the PMOS device region 100b contains $Si_xGe_{1-x}$.

The STI 101 is formed to electrically isolate the NMOS device region 100a from the PMOS device region 100b and the STI 101 horizontally defines boundaries of the device regions 100a and 100b. The STI 101 may be formed using conventional methods, for example by selectively etching an opening in the substrate 100 using a patterned mask or photoresist, depositing silicon oxide or silicon nitride to fill the opening, and then planarizing the oxide or nitride. The NMOS device region 100a is doped with n-type dopants and the PMOS device region 100b is doped with p-type dopants.

FIG. 1A further shows an interface layer 102 is formed on the NMOS device region 100a and the PMOS device region 100b. The interface layer 102 can, for example, contain high mobility, low defect oxide (e.g., $SiO_2$). The interface layer 102 may be a chemical oxide formed by oxidizing a surface of substrate 100 in an aqueous bath (e.g., a bath containing deionized (DI) water and ozone ($O_3$)), an oxide formed by oxidation of a surface of substrate 100 during or following the deposition of the high-k film 104, or an oxide deposited onto a surface of substrate 100 by gas phase deposition using reactant gases. The interface layer 102 can have a thickness between about 6 Angstrom and about 15 Angstrom, for example.

Figure 1B:
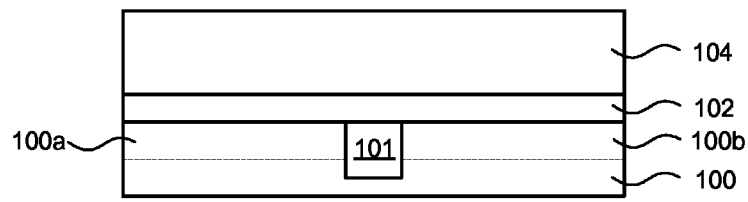

FIG. 1B shows a high-k film 104 deposited on the interface layer 102. The interface layer 102 has a lower dielectric constant than the high-k film 104 and, therefore, the presence of the interface layer 102 increases the effective oxide thickness (EOT) of the combination of the interface layer 102 and the high-k film 104. The high-k film 104 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the high-k film 104 can contain an oxide, oxynitride, or titanate layer containing one or more elements selected from Group II (beryllium (Be), magnesium (Mg), calcium (Ca), strontium (Sr), and barium (Ba)), and elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanium oxide ($La_2O_3$) and lutetium oxide ($Lu_2O_3$). Examples of titanate layers include barium titanate ($BaTiO_3$), strontium titanate ($SrTiO_3$), and barium strontium titanate ($BaSrTiO_3$).

According to embodiments of the invention, the high-k film 104 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the high-k film 104 can, for example, be at least 2 Angstrom, between about 2 Angstrom and about 60 Angstrom, between about 5 Angstrom and about 30 Angstrom, or between about 5 Angstrom and about 15 Angstrom.

Figure 1C:
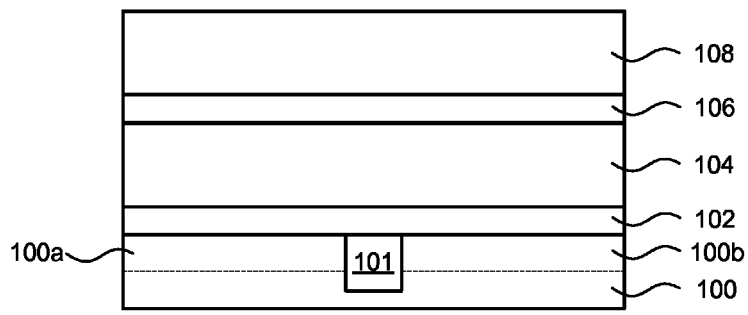

FIG. 1C shows a cap layer 106 deposited on the high-k film 104 over the NMOS device region 100a and the PMOS device region 100b. The cap layer 106 contains a first chemical element for diffusion into the high-k film 104 in the NMOS device region 100a during a heat-treating process. According to embodiments of the invention, the cap layer 106 has a different chemical composition than the high-k film 104 and includes a dielectric material containing a first chemical element selected from Mg, Ca, Sr, Ba, Sc, Y, La, Ce, Pr, Nd, Pm, Sm, Eu, Gd, Tb, Dy, Ho, Er, Tm, Yb, or Lu, or a combination thereof. The dielectric material can contain a metal oxide, a metal nitride, or a metal oxynitride, or a combination thereof. Examples of rare earth metal oxides include yttrium oxide ($Y_2O_3$), lanthanum oxide ($La_2O_3$) and lutetium oxide ($Lu_2O_3$).

The cap layer 106 may be deposited by atomic layer deposition (ALD), plasma-enhanced ALD (PEALD), chemical vapor deposition (CVD), plasma-enhanced CVD (PECVD), or sputtering. A thickness of the cap layer 106 can, for example, be between about 5 Angstrom and about 200 Angstrom, between about 10 Angstrom and about 30 Angstrom, between about 30 Angstrom and about 100 Angstrom, or between about 100 Angstrom and about 200 Angstrom. The thickness of the cap layer 106 is selected to provide an adequate supply of the first chemical element for diffusion into the high-k film 104 in the NMOS device region 100a to reach a targeted threshold voltage shift. In other words, the thicker the cap layer 106, the greater the available supply of the first chemical element.

FIG. 1C further shows an optional first barrier film 108 containing, for example, one or more of TiN, TiC, TiCN, TiAlN, TiSiN, TaN, TaC, TaCN, TaAlN, TaSiN, amorphous Si, or poly-Si, deposited on the cap layer 106. A thickness of the optional first barrier film 108 can be between about 50 and 200 Angstrom, for example. The optional first barrier film 108 provides physical separation of the cap layer 106 from any subsequent layers formed on the optional first barrier film 108, such as a mask layer or photoresist. The optional first barrier film 108 can prevent or significantly reduce oxygen diffusion into the cap layer 106 from a gaseous environment during heat-treating processes.

Figure 1D:
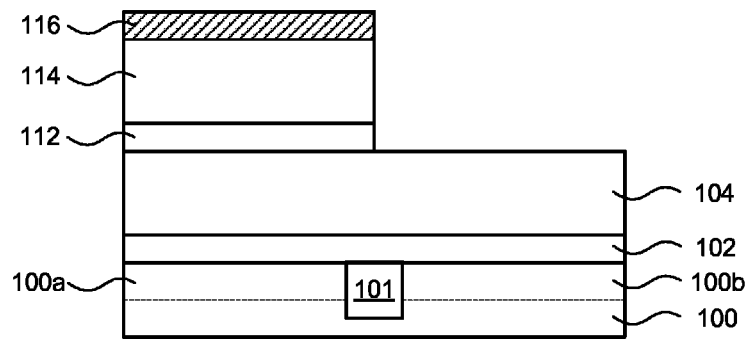

FIG. 1D shows a first cap layer 112 selectively formed on the high-k film 104 in the NMOS device region 100a and a patterned optional first barrier film 114 formed on the first cap layer 112. The patterned film structure in FIG. 1D may be formed by removing the cap layer 106 and the optional first barrier film 108 in the PMOS device region 100b by standard lithography and etching methods that can utilize a patterned mask 116 formed over the NMOS device region 100a. The pattern transfer may use one or more etching steps to remove the unprotected portions of the optional first barrier film 108 and the cap layer 106 above the high-k film 104 in the PMOS device region 100b. The one or more etching steps can, for example, include plasma etching, reactive ion etching (RIE), or wet etching using an etchant species in liquid solution. The patterned mask 116 can contain photoresist. In some examples, the patterned mask 116 can contain an organic mask or silicon nitride (SiN). For example, a photolithography tool may be used to image a pattern onto a photoresist material (not shown) deposited on the film structure in FIG. 1C. The patterned mask 116 provides a physical barrier during a subsequent etching process that selectively removes material not protected by the patterned mask 116.

In one example, the patterned optional first barrier film 114 (e.g., TiN) and the cap layer 106 may be plasma etched with high etch selectivity to the high-k film 104 using a chlorine-based process gas (e.g., $BCl_3/Cl_2/O_2/Ar$). However, low substrate temperatures (e.g., less than 200° C., for example around room temperature and below) are preferred since the high etch selectivity may be lost at temperatures above 200° C. due to increased volatility of the etch products at these temperatures. Similarly, a fluorine-based process gas (e.g., $CF_4/O_2$) may be used at temperatures above room temperature while maintaining high etch selectivity to the high-k film 104.

Thereafter, the patterned mask 116 is removed, for example, using a non-oxidizing ashing process or a wet etching process that avoids oxidizing the patterned optional first barrier film 114 and the first cap layer 112. In one example, an organic mask may be removed in a plasma process using a process gas containing $N_2/H_2$. In some examples, the patterned optional first barrier film 114 (e.g., TiN) and the patterned mask 116 may be selectively removed relative to the high-k film 104 using a wet etching process utilizing a combination of $NH_4OH$ and HF.

Figure 1E:
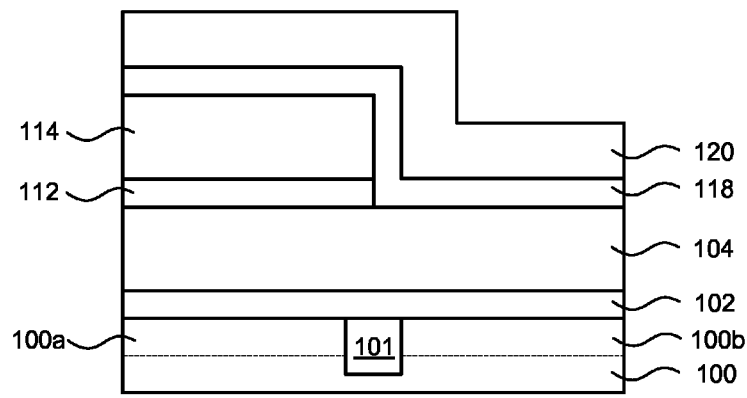

FIG. 1E schematically shows a second cap layer 118 deposited over the first cap layer 112 and on the high-k film 104 in the exposed PMOS device region 100b. The second cap layer 118 contains a second chemical element capable of scavenging oxygen from the interface layer 102. According to embodiments of the invention, the second cap layer 118 has a different chemical composition than the high-k film 104 and the first cap layer 112 and includes a metal layer (i.e., zero valent metal) and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof. The second cap layer 118 may be deposited by atomic layer deposition (ALD), plasma-enhanced ALD (PEALD), chemical vapor deposition (CVD), plasma-enhanced CVD (PECVD), or sputtering. A thickness of the second cap layer 118 can, for example, be between about 5 Angstrom and about 200 Angstrom, between about 10 Angstrom and about 30 Angstrom, between about 30 Angstrom and about 100 Angstrom, or between about 100 Angstrom and about 200 Angstrom. The thickness of the second cap layer 118 is selected to provide desired reduction or elimination of the interface layer 102 by scavenging of oxygen by the second chemical element in the second cap layer 118. The reduction or elimination of the interface layer 102 occurs by oxygen diffusion from the interface layer 102 into the second cap layer 118 during a heat-treating process.

FIG. 1E further shows an optional second barrier film 120 containing, for example, one or more layers of TiN, TiC, TiCN, TiAlN, TiSiN, TaN, TaC, TaCN, TaAlN, TaSiN, amorphous Si, or poly-Si, deposited on the second cap layer 118. A thickness of the optional second barrier film 120 can be between about 50 Angstrom and 200 Angstrom, for example. The optional second barrier film 120 provides physical separation of the second cap layer 118 from any further layers formed on the optional second barrier film 120. The optional second barrier film 120 can prevent or reduce oxygen diffusion into the second cap layer 118 from a gaseous environment during heat-treating processes.

Figure 1F:
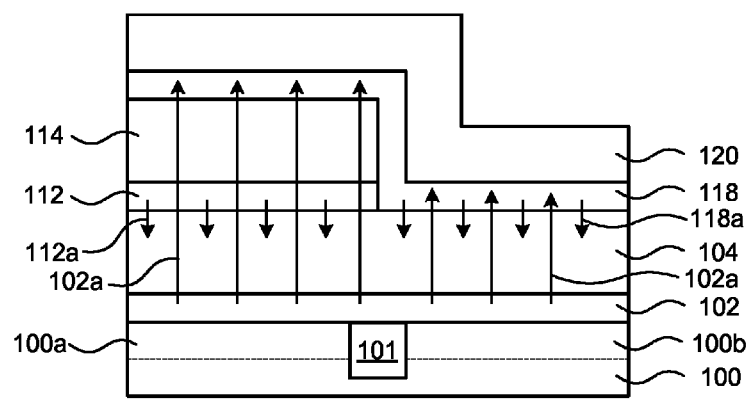

FIG. 1F schematically shows a heat-treating process performed to diffuse the first chemical element 112a from the first cap layer 112 into the high-k film 104 in the NMOS device region 100a. Further, as depicted in FIG. 1F, second chemical element 118a (e.g., Al) may diffuse from the second cap layer 118 into the high-k film 104 in the PMOS device region 100b. Further, during the heat-treating, oxygen species 102a diffuse from the interface layer 102 (e.g., SiO$_2$) through the high-k film 104 and the first cap layer 112 in the NMOS device region 100a, and into the second cap layer 118 over the NMOS and PMOS device regions 100a/100b, thereby reducing the thickness of or eliminating the interface layer 102.

The heat-treating process may utilize a substrate temperature, time, and gaseous environment (e.g., an inert gaseous environment containing a noble gas or N$_2$), that results in a targeted diffusion of the first chemical element 112a (e.g., La or Ba) into the high-k film 104 in the NMOS device region 100a, and optionally diffusion of the second chemical element 118a (e.g., Al) into the high-k film 104 in the PMOS device region 100b. In one example, the heat-treating may include a rapid thermal anneal (RTA) with a fast positive temperature ramping rate to a target temperature between about 800° C. and 1200° C., in an inert gaseous atmosphere, followed by a hold at the target temperature, and subsequent rapid temperature ramp down. However, other target temperatures may be used, for example between about 900° C. and 1100° C., or between 1000° C. and 1200° C.

The second cap layer 118 scavenges oxygen from the interface layer 102 by oxygen diffusion through the high-k film 104 and the first cap layer 112, and into the second cap layer 118 in both the NMOS device region 100a and the PMOS device region 100b. Further, the second cap layer 118 may scavenge oxygen diffusing through other material layers from a gaseous processing environment during the heat-treating. This oxygen scavenging maintains a constant or nearly constant device threshold voltage, even after a high temperature heat-treating or anneal in an oxygen ambient. By reducing the thickness of or eliminating the interface layer 102 altogether, the effective oxide thickness (EOT) of the composite gate stack is reduced, thereby, enhancing the scalability of the composite gate stack and performance of the field effect transistor.

Figure 1G:
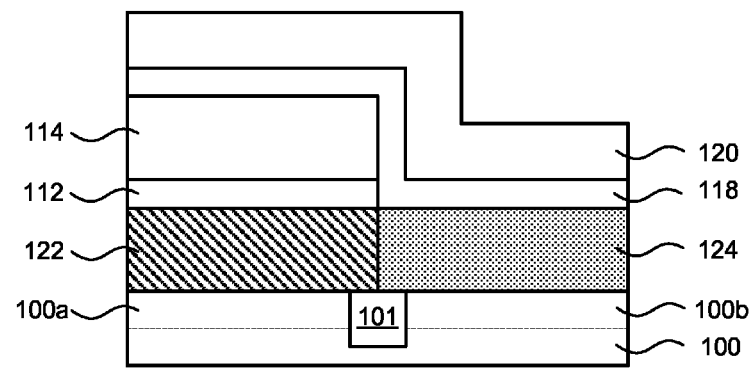

FIG. 1G schematically shows the resulting film structure following the heat-treating process. The diffusion described above forms a first high-k film 122 over the NMOS device region 100a and a second high-k film 124 over the PMOS device region 100b. The interface layer 102 from FIG. 1E is reduced in thickness or eliminated by the scavenging properties of the second cap layer 118.

After the heat-treating, further processing includes removing from the high-k film 104 the first cap layer 112, the second cap layer 118, the patterned optional first barrier film 114, and the optional second barrier film 120. Those films and layers may be removed using a plasma formed from a chlorine-based process gas (e.g., BCl$_3$/Cl$_2$/O$_2$/Ar) with high etch selectivity to the first high-k film 122 and the second high-k film 124. However, low substrate temperatures (e.g., approximately room temperature and below) are preferred during the etching since the high etch selectivity may be lost at temperatures above 200° C. due to increased volatility of the etch products at these temperatures. Similarly, a fluorine-based process gas (e.g., CF$_4$/O$_2$) may be used at temperatures near or above room temperature while maintaining high etch selectivity to the first high-k film 122 and the second high-k film 124. However, fluorine chemistry (such as CF$_4$/O$_2$) is normally not effective in etching aluminum in the second cap layer 118. Alternatively, a wet etching process that uses a combination of phosphoric acid, acetic acid, and nitric acid may be used to remove TiN, Al and oxidized Al metal, with good selectivity to the first high-k film 122 and the second high-k film 124.

Figure 1H:
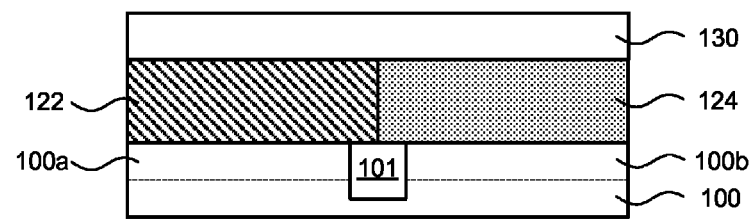

Thereafter, a gate electrode film 130 is deposited on the first high-k film 122 and the second high-k film 124. The gate electrode film 130 can, for example, have a thickness between about 5 nm (nanometers) and about 40 nm, or between about 5 nm and about 10 nm and can, for example, contain W, WN, WSi$_x$, Al, Mo, Ta, TaN, TaSiN, HfN, HfSiN, Ti, TiN, TiSiN, Mo, MoN, Re, Pt, Ru, or Si. FIG. 1H shows the film stack following deposition of the gate electrode film 130 on first high-k film 122 and the second high-k film 124.

As is apparent from the above description, embodiments of the invention enable the use of the same gate electrode film 130 in both the NMOS device region 100a the PMOS device region 100b. This provides a gate stack with the same stack height for both the NMOS device region 100a and the PMOS device region 100b which can simplify processing of the gate stack in subsequent etching steps compared to a dual-metal-containing gate integration where two different gate stack heights must be simultaneously etched. From this point on, well-known processing schemes may be utilized. In one example, a gate first integration can continue as normal. In another example, a gate last integration is similarly possible by using a Si gate electrode 130 instead of a TiN gate electrode 130.

As described above, FIGS. 1A-1H illustrate an embodiment of the invention that includes providing a substrate with defined NMOS and PMOS device regions and an interface layer on the NMOS and PMOS device regions, depositing a high-k film on the interface layer, and depositing a first cap layer on the high-k film, where the first cap layer contains a first chemical element for modifying the high-k film in the NMOS device region. The method further includes removing the first cap layer from the high-k film in the PMOS device region, depositing a second cap layer on the first cap layer in the NMOS device region and on the high-k film in the PMOS device region, where the second cap layer contains a second chemical element for scavenging oxygen from the interface layer. The method still further includes performing a heat-treating process to diffuse the first chemical element into the high-k film in the NMOS device region and to reduce or eliminate the interface layer by oxygen diffusion from the interface layer through the high-k film into the second cap layer, removing the first and second cap layers from the high-k film, and depositing a gate electrode film over the high-k film.

Figure 2A:
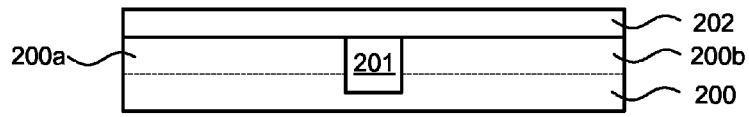
FIGS. 2A-2H show schematic cross-sectional views of a process flow for a gate integration scheme according to an embodiment of the invention.
Figure 2B:
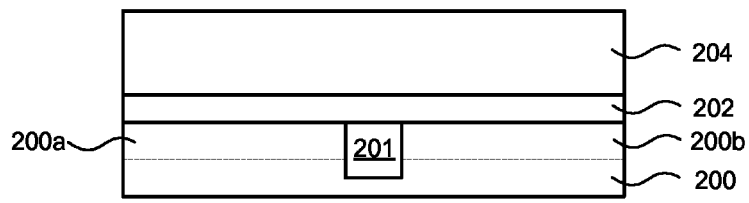
Figure 2C:
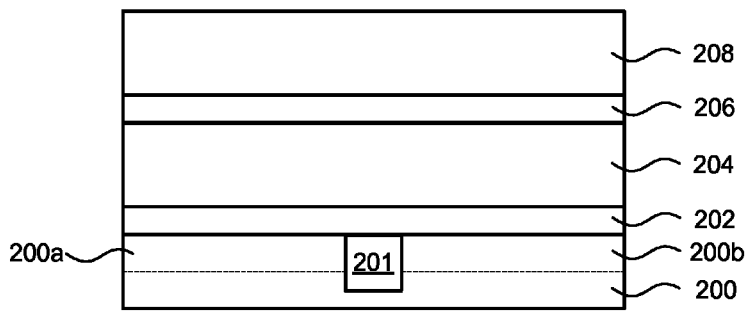
Figure 2D:
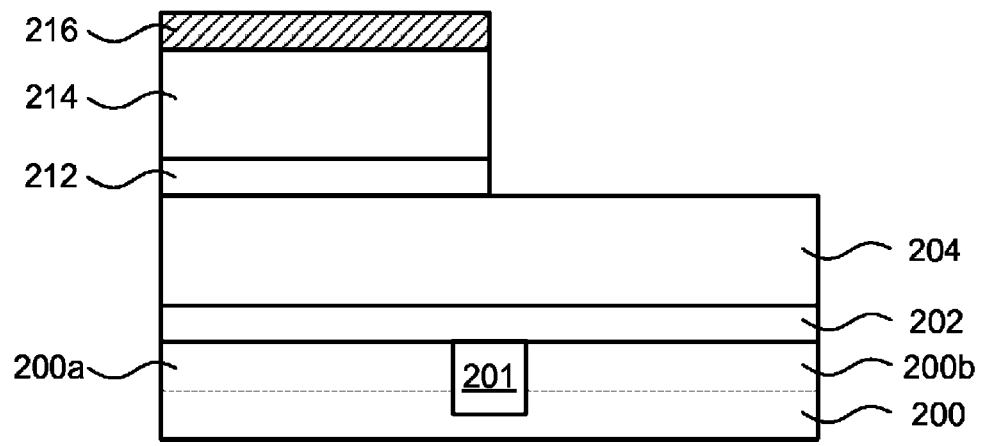
Figure 2E:
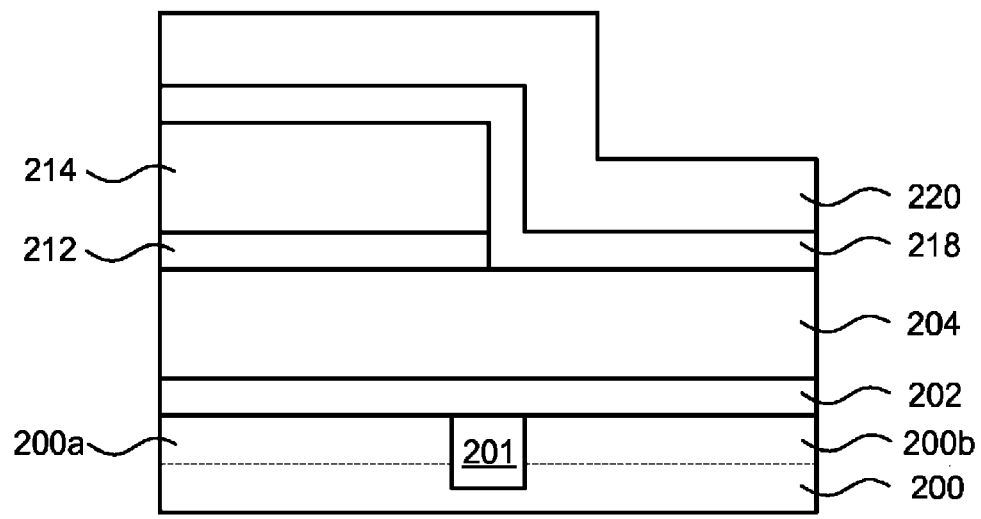
Figure 2F:
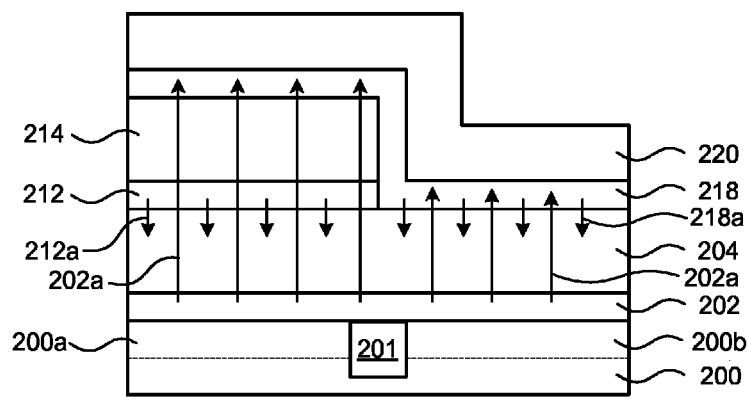
Figure 2G:
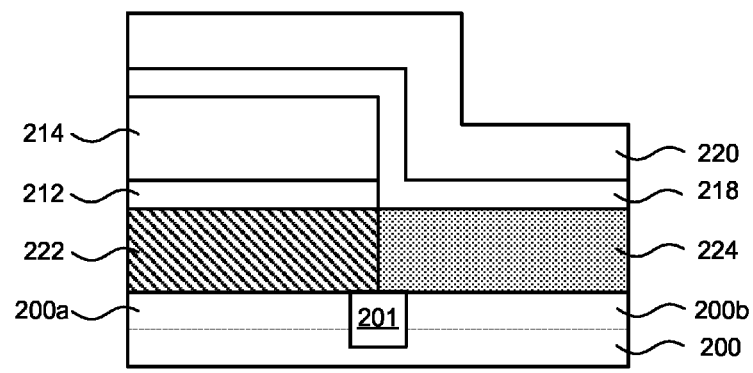
Figure 2H:
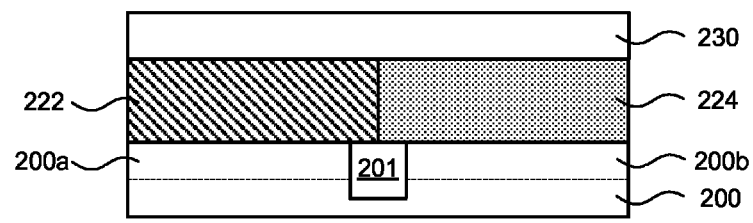

FIGS. 2A 2H show schematic cross-sectional views of a process flow for a gate integration scheme according to another embodiment of the invention. FIG. 2A schematically shows a substrate 200 containing a PMOS device region 200a and a NMOS device region 200b that are separated by a shallow trench isolation (STI) 201. Depending on the type of device being fabricated, the substrate 200 and the regions 200a/200b may contain bulk silicon substrate, single crystal silicon (doped or undoped), semiconductor on insulator (SOI) substrate, or any other semiconductor material including, for example, Si, SiC, SiGe, SiGeC, Ge, GaAs, InAs, InP, as well as other III/V or II/VI compound semiconductors or any combinations thereof. The substrate 200 can be of any size, for example a 200 mm substrate, a 300 mm substrate, or an even larger substrate. In one example, the substrate 200 can include a tensile-strained Si layer. According to another embodiment, the substrate 200 may contain Ge or Si$_x$Ge$_{1-x}$ compounds, where x is the atomic fraction of Si, 1-x is the atomic fraction of Ge, and 0<1-x<1. Exemplary Si$_x$Ge$_{1-x}$ compounds include Si$_{0.1}$Ge$_{0.9}$, Si$_{0.2}$Ge$_{0.8}$, Si$_{0.3}$Ge$_{0.7}$, Si$_{0.4}$Ge$_{0.6}$, Si$_{0.5}$Ge$_{0.5}$, Si$_{0.6}$Ge$_{0.4}$, Si$_{0.7}$Ge$_{0.3}$, Si$_{0.8}$Ge$_{0.2}$, and Si$_{0.9}$Ge$_{0.1}$. In one example, the substrate 200 can contain a compressive-strained Ge layer or a tensile-strained Si$_x$Ge$_{1-x}$ (x>0.5) deposited on a relaxed Si$_{0.5}$Ge$_{0.5}$ buffer layer. In one example, the substrate 200 includes Si and the PMOS device region 200a contains Si$_x$Ge$_{1-x}$.

The STI 201 is formed to electrically isolate the PMOS device region 200a from the NMOS device region 200b and the STI 201 horizontally defines boundaries of the device regions 200a and 200b. The STI 201 may be formed using conventional methods, for example by selectively etching an opening in the substrate 200 using a patterned mask or photoresist, depositing silicon oxide or silicon nitride to fill the opening, and then planarizing the oxide or nitride. The PMOS device region 200a is doped with p-type dopants and the NMOS device region 200b is doped with n-type dopants.

FIG. 2A further shows an interface layer 202 is formed on the PMOS device region 200a and the NMOS device region 200b. The interface layer 202 can, for example, contain high mobility, low defect oxide (e.g., $SiO_2$). The interface layer 202 may be a chemical oxide formed by oxidizing a surface of substrate 200 in an aqueous bath (e.g., a bath containing deionized (DI) water and ozone ($O_3$)), an oxide formed by oxidation of a surface of substrate 200 during or following the deposition of the high-k film 204, or an oxide deposited onto a surface of substrate 200 by gas phase deposition using reactant gases. The interface layer 202 can have a thickness between about 6 Angstrom and about 15 Angstrom, for example.

FIG. 2B shows a high-k film 204 deposited on the interface layer 202. The interface layer 202 has a lower dielectric constant than the high-k film 204 and, therefore, the presence of the interface layer 202 increases the effective oxide thickness (EOT) of the combination of the interface layer 202 and the high-k film 204. The high-k film 204 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the high-k film 204 can contain an oxide, oxynitride, or titanate layer containing one or more elements selected from Group II (beryllium (Be), magnesium (Mg), calcium (Ca), strontium (Sr), and barium (Ba), and elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanium oxide ($La_2O_3$) and lutetium oxide ($Lu_2O_3$). Examples of titanate layers include barium titanate ($BaTiO_3$), strontium titanate ($SrTiO_3$), and barium strontium titanate ($BaSrTiO_3$).

According to embodiments of the invention, the high-k film 204 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the high-k film 204 can, for example, be at least 2 Angstrom, between about 2 Angstrom and about 60 Angstrom, between about 5 Angstrom and about 30 Angstrom, or between about 5 Angstrom and about 15 Angstrom.

FIG. 2C shows a cap layer 206 deposited on the high-k film 204 over the PMOS device region 200a and the NMOS device region 200b. According to embodiments of the invention, the cap layer 206 has a different chemical composition than the high-k film 204. The cap layer 206 contains a first chemical element capable of scavenging oxygen from the interface layer 202. The cap layer 206 includes a metal layer (i.e., zero valent metal) and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof. The cap layer 206 may be deposited by atomic layer deposition (ALD), plasma-enhanced ALD (PEALD), chemical vapor deposition (CVD), plasma-enhanced CVD (PECVD), or sputtering. A thickness of the cap layer 206 can, for example, be between about 5 Angstrom and about 200 Angstrom, between about 10 Angstrom and about 30 Angstrom, between about 30 Angstrom and about 100 Angstrom, or between about 100 Angstrom and about 200 Angstrom. The thickness of the cap layer 206 is selected to provide desired reduction or elimination of the interface layer 202 by scavenging of oxygen by the first chemical element in the cap layer 206. The reduction or elimination of the interface layer 202 occurs by oxygen diffusion from the interface layer 202 into the cap layer 206 during a heat-treating process.

FIG. 2C further shows an optional first barrier film 208 containing, for example, one or more of TiN, TiC, TiCN, TiAlN, TiSiN, TaN, TaC, TaCN, TaAlN, TaSiN, amorphous Si, or poly-Si, deposited on the cap layer 206. A thickness of the optional first barrier film 208 can be between about 50 and 200 Angstrom, for example. The optional first barrier film 208 provides physical separation of the cap layer 206 from any subsequent layers formed on the optional first barrier film 208, such as a mask layer or photoresist. The optional first barrier film 208 can prevent or significantly reduce oxygen diffusion into the cap layer 206 from a gaseous environment during heat-treating processes.

FIG. 2D shows a first cap layer 212 selectively formed on the high-k film 204 in the PMOS device region 200a and a patterned optional first barrier film 214 formed on the first cap layer 212. The patterned film structure in FIG. 2D may be formed by removing the cap layer 206 and the optional first barrier film 208 in the NMOS device region 200b by standard lithography and etching methods that can utilize a patterned mask 216 formed over the PMOS device region 200a. The pattern transfer may use one or more etching steps to remove the unprotected portions of the optional first barrier film 208 and the cap layer 206 above the high-k film 204 in the NMOS device region 200b. The one or more etching steps can, for example, include plasma etching, reactive ion etching (RIE), or wet etching using an etchant species in liquid solution. The patterned mask 216 can contain photoresist. In some examples, the patterned mask 216 can contain an organic mask or silicon nitride (SiN). For example, a photolithography tool may be used to image a pattern onto a photoresist material (not shown) deposited on the film structure in FIG. 2C. The patterned mask 216 provides a physical barrier during a subsequent etching process that selectively removes material not protected by the patterned mask 216.

In one example, the patterned optional first barrier film 214 (e.g., TiN) and the cap layer 206 may be plasma etched with high etch selectivity to the high-k film 204 using a chlorine-based process gas (e.g., $BCl_3/Cl_2/O_2/Ar$). However, low substrate temperatures (e.g., less than 200° C., for example around room temperature and below) are preferred since the high etch selectivity may be lost at temperatures above 200° C. due to increased volatility of the etch products at these temperatures. Similarly, a fluorine-based process gas (e.g., $CF_4/O_2$) may be used at temperatures above room temperature while maintaining high etch selectivity to the high-k film 204.

Thereafter, the patterned mask 216 is removed, for example, using a non-oxidizing ashing process or a wet etching process that avoids oxidizing the patterned optional first barrier film 214 and the first cap layer 212. In one example, an organic mask may be removed in a plasma process using a process gas containing $N_2/H_2$. In some examples, the patterned optional first barrier film 214 (e.g., TiN) and the patterned mask 216 may be selectively removed relative to the high-k film 204 using a wet etching process utilizing a combination of $NH_4OH$ and HF.

FIG. 2E schematically shows a second cap layer 218 deposited over the first cap layer 212 and on the high-k film 204 in the exposed NMOS device region 200b. The second cap layer 218 contains a second chemical element for diffusion into the high-k film 204 in the NMOS device region 200b during a heat-treating process. According to embodiments of the invention, the second cap layer 206 has a different chemical composition than the high-k film 204 and the first cap layer 212 and includes a dielectric material containing a first chemical element selected from Mg, Ca, Sr, Ba, Sc, Y, La, Ce, Pr, Nd, Pm, Sm, Eu, Gd, Tb, Dy, Ho, Er, Tm, Yb, or Lu, or a combination thereof. The dielectric material can contain a metal oxide, a metal nitride, or a metal oxynitride, or a combination thereof. Examples of rare earth metal oxides include yttrium oxide ($Y_2O_3$), lanthanum oxide ($La_2O_3$) and lutetium oxide ($Lu_2O_3$).

The second cap layer 218 may be deposited by atomic layer deposition (ALD), plasma-enhanced ALD (PEALD), chemical vapor deposition (CVD), plasma-enhanced CVD (PECVD), or sputtering. A thickness of the second cap layer 218 can, for example, be between about 5 Angstrom and about 200 Angstrom, between about 10 Angstrom and about 30 Angstrom, between about 30 Angstrom and about 200 Angstrom, or between about 200 Angstrom and about 200 Angstrom. The thickness of the second cap layer 206 is selected to provide an adequate supply of the second chemical element for diffusion into the high-k film 204 in the NMOS device region 200b to reach a targeted threshold voltage shift. In other words, the thicker the second cap layer 218, the greater the available supply of the second chemical element.

FIG. 2E further shows an optional second barrier film 220 containing, for example, one or more layers of TiN, TiC, TiCN, TiAlN, TiSiN, TaN, TaC, TaCN, TaAlN, TaSiN, amorphous Si, or poly-Si, deposited on the second cap layer 218. A thickness of the optional second barrier film 220 can be between about 50 Angstrom and 200 Angstrom, for example. The optional second barrier film 220 provides physical separation of the second cap layer 218 from any further layers formed on the optional second barrier film 220. The optional second barrier film 220 can prevent or reduce oxygen diffusion into the second cap layer 218 from a gaseous environment during heat-treating processes.

FIG. 2F schematically shows a heat-treating process performed to diffuse the second chemical element 218a from the second cap layer 218 into the high-k film 204 in the NMOS device region 200b. Further, as depicted in FIG. 2F, first chemical element 212a (e.g., Al) may diffuse from the first cap layer 212 into the high-k film 204 in the PMOS device region 200a. Further, during the heat-treating, oxygen species 202a diffuse from the interface layer 202 (e.g., $SiO_2$) through the high-k film 204 and the first cap layer 212 in the PMOS device region 200a, and into the second cap layer 218 over the PMOS and NMOS device regions 200a/200b, thereby reducing the thickness of or eliminating the interface layer 202.

The heat-treating process may utilize a substrate temperature, time, and gaseous environment (e.g., an inert gaseous environment containing a noble gas or $N_2$), that results in a targeted diffusion of the second chemical element 218a (e.g., La or Ba) into the high-k film 204 in the NMOS device region 200b, and optionally diffusion of the first chemical element 212a (e.g., Al) into the high-k film 204 in the PMOS device region 200a. In one example, the heat-treating may include a rapid thermal anneal (RTA) with a fast positive temperature ramping rate to a target temperature between about 800° C. and 1200° C., in an inert gaseous atmosphere, followed by a hold at the target temperature, and subsequent rapid temperature ramp down. However, other target temperatures may be used, for example between about 900° C. and 1100° C., or between 1000° C. and 1200° C.

The second cap layer 218 scavenges oxygen from the interface layer 202 by oxygen diffusion through the high-k film 204 and the first cap layer 212, and into the second cap layer 218 in both the PMOS device region 200a and the NMOS device region 200b. Further, the second cap layer 218 may scavenge oxygen diffusing through other material layers from a gaseous processing environment during the heat-treating. This oxygen scavenging maintains a constant or nearly constant device threshold voltage, even after a high temperature heat-treating or anneal in an oxygen ambient. By reducing the thickness of or eliminating the interface layer 202 altogether, the effective oxide thickness (EOT) of the composite gate stack is reduced, thereby, enhancing the scalability of the composite gate stack and performance of the field effect transistor.

FIG. 2G schematically shows the resulting film structure following the heat-treating process. The diffusion described above forms a first high-k film 222 over the PMOS device region 200a and a second high-k film 224 over the NMOS device region 200b. The interface layer 202 from FIG. 2E is reduced in thickness or eliminated by the scavenging properties of the second cap layer 218.

After the heat-treating, further processing includes removing from the high-k film 204 the first cap layer 212, the second cap layer 218, the patterned optional first barrier film 214, and the optional second barrier film 220. Those films and layers may be removed using a plasma formed from a chlorine-based process gas (e.g., $BCl_3/Cl_2/O_2/Ar$) with high etch selectivity to the first high-k film 222 and the second high-k film 224. However, low substrate temperatures (e.g., approximately room temperature and below) are preferred during the etching since the high etch selectivity may be lost at temperatures above 200° C. due to increased volatility of the etch products at these temperatures. Similarly, a fluorine-based process gas (e.g., $CF_4/O_2$) may be used at temperatures near or above room temperature while maintaining high etch selectivity to the first high-k film 222 and the second high-k film 224. However, fluorine chemistry (such as $CF_4/O_2$) is normally not effective in etching aluminum in the second cap layer 218. Alternatively, a wet etching process that uses a combination of phosphoric acid, acetic acid, and nitric acid may be used to remove TiN, Al and oxidized Al metal, with good selectivity to the first high-k film 222 and the second high-k film 224.

Thereafter, a gate electrode film 230 is deposited on the first high-k film 222 and the second high-k film 224. The gate electrode film 230 can, for example, have a thickness between about 5 nm (nanometers) and about 40 nm, or between about 5 nm and about 10 nm and can, for example, contain W, WN, $WSi_x$, Al, Mo, Ta, TaN, TaSiN, HfN, HfSiN, Ti, TiN, TiSiN, Mo, MoN, Re, Pt, Ru, or Si. FIG. 2H shows the film stack following deposition of the gate electrode film 230 on first high-k film 222 and the second high-k film 224.

As is apparent from the above description, embodiments of the invention enable the use of the same gate electrode film 230 in both the PMOS device region 200*a* the NMOS device region 200*b*. This provides a gate stack with the same stack height for both the PMOS device region 200*a* and the NMOS device region 200*b* which can simplify processing of the gate stack in subsequent etching steps compared to a dual-metal-containing gate integration where two different gate stack heights must be simultaneously etched. From this point on, well-known processing schemes may be utilized. In one example, a gate first integration can continue as normal. In another example, a gate last integration is similarly possible by using a Si gate electrode 230 instead of a TiN gate electrode 230.

As described above, FIGS. 2A-2H illustrate an embodiment of the invention that includes providing a substrate with defined NMOS and PMOS device regions, and an interface layer on the NMOS and PMOS device regions, depositing a high-k film on the interface layer, and depositing a first cap layer on the high-k film, wherein the first cap layer contains a first chemical element for scavenging oxygen from the interface layer. The method further includes removing the first cap layer from the high-k film in the NMOS device region, depositing a second cap layer on the first cap layer in the PMOS device region and on the high-k film in the NMOS device region, where the second cap layer contains a second chemical element for modifying the high-k film in the NMOS device region. The method still further includes performing a heat-treating process to diffuse the second chemical element into the high-k film in the NMOS device region and to reduce or eliminate the interface layer by oxygen diffusion from the interface layer through the high-k film into the second cap layer, removing the first and second cap layers from the high-k film, and depositing a gate electrode film over the high-k film.

Figure 3A:
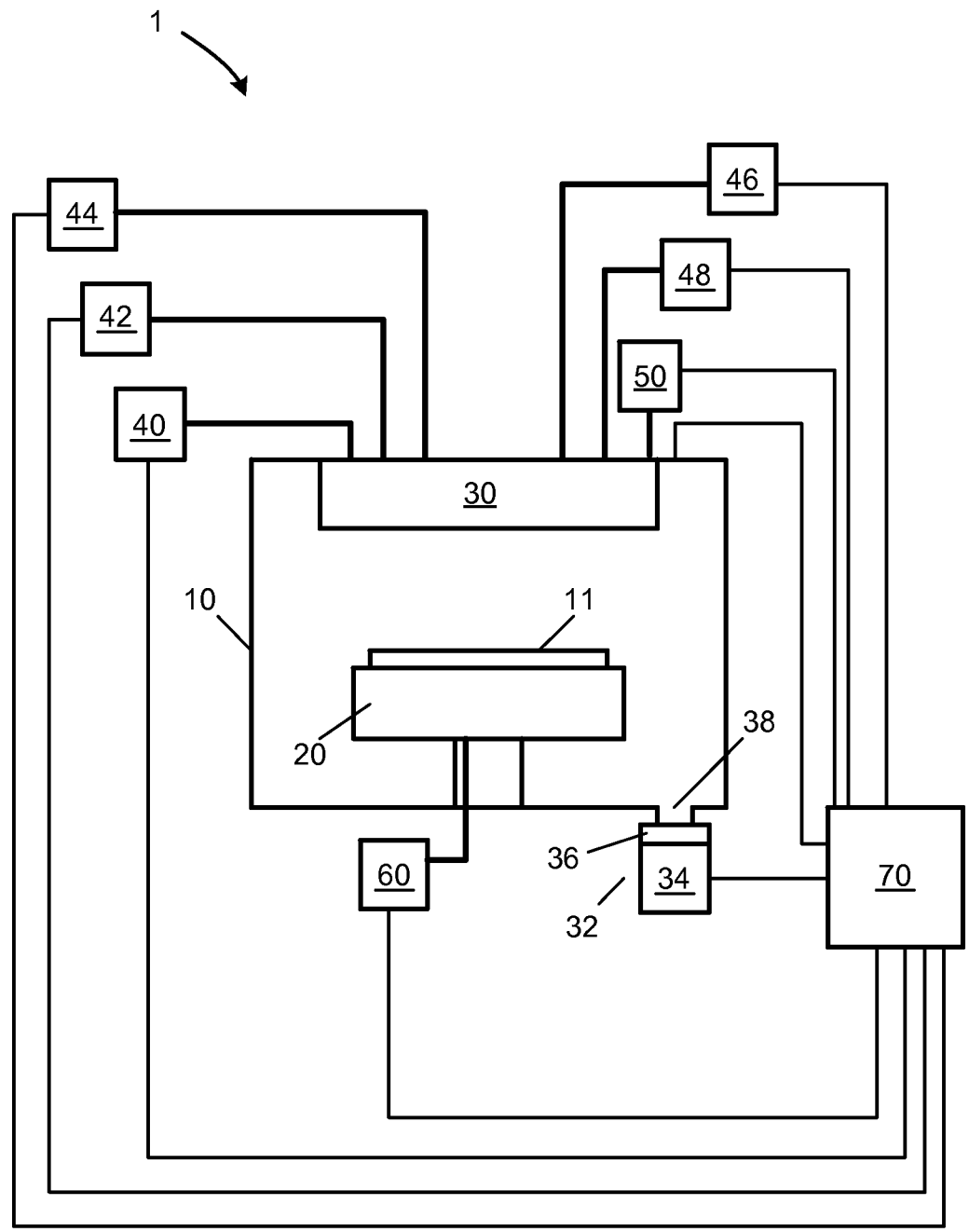
FIGS. 3A and 3B illustrate processing systems for depositing films and layers on a substrate according to embodiments of the invention.

FIG. 3A illustrates a processing system 1 that may be utilized for depositing one or more of the films and layers described above, including the high-k film 104, the cap layer 106, and the second cap layer 118 according to one embodiment of the invention. The processing system 1 may be configured for performing ALD or CVD processing. The processing system 1 includes a process chamber 10 having a substrate holder 20 configured to support a substrate 100, upon which the film or layer is formed. The process chamber 10 further contains an upper assembly 30 (e.g., a showerhead) coupled to a first precursor supply system 40 (e.g., hafnium precursor supply system), a second precursor supply system 42 (e.g., lanthanum or aluminum precursor supply system), a purge gas supply system 44, an oxygen-containing gas supply system 46, a nitrogen-containing gas supply system 48, and an auxiliary gas supply system 50 for supplying one or more elements selected from Mg, Ca, Sr, Ba Sc, Y, La, Ce, Pr, Nd, Pm, Sm, Eu, Gd, Tb, Dy, Ho, Er, Tm, Yb, or Lu, or a combination thereof, or other elements, for example silicon. In addition, the oxygen-containing gas supply system 46 or the nitrogen-containing gas supply system 48 may be configured to supply an oxygen-containing gas and nitrogen-containing gas, respectively. Additionally, processing system 1 includes a substrate temperature control system 60 coupled to substrate holder 20 and configured to elevate and control the temperature of substrate 100. Furthermore, the processing system 1 includes a controller 70 that can be coupled to process chamber 10, substrate holder 20, upper assembly 30 configured for introducing process gases into the process chamber 10, first precursor supply system 40, second precursor supply system 42, purge gas supply system 44, oxygen-containing gas supply system 46, nitrogen-containing gas supply system 48, auxiliary gas supply system 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 3A, singular processing elements (10, 20, 30, 40, 42, 44, 46, 48, 50, and 60) are shown, but this is not required for the invention. The processing system 1 can include any number of processing elements having any number of controllers associated with them in addition to independent processing elements. The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 3A, the processing system 1 may be configured to process 200 mm substrates, 300 mm substrates, or larger-sized substrates. In fact, it is contemplated that the processing system 1 may be configured to process substrates or wafers regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the films or layers described in the embodiments of the invention.

The first precursor supply system 40 and the second precursor supply system 42 may be configured to alternately or simultaneously introduce a first precursor and a second precursor to process chamber 10. The alternation of the introduction of the first and second precursors can be cyclical, or it may be acyclical with variable time periods between introduction of the first and second precursors.

According to embodiments of the invention, several methods may be utilized for introducing the first and/or second precursors to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired stoichiometry can be attained within the deposited film. Another method of delivering the first and second precursors includes separately controlling two or more different liquid sources (neat precursors or precursor solutions), which are then mixed prior to entering a common vaporizer. This method may be utilized when the precursors are compatible in solution or in liquid form and they have similar vaporization characteristics. Yet another method of delivering the first and second precursor includes controlling the flow of a liquid precursor mixture (neat precursors or precursor solutions) to a common vaporizer. Other methods include the use of compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the first and second precursors within a gas pulse, it is possible to deposit films with desired stoichiometries. In one example, hafnium zirconium based films can contain between 5 and 95 atomic percent zirconium (5%<% Zr/(% Zr+% Hf)<95%), and between 5 and 95 atomic percent hafnium (5%<% Hf/(% Zr+% Hf)<95%).

Embodiments of the invention may utilize a wide variety of hafnium and zirconium precursors. For example, representative examples include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $HfCl_4$, $ZrCl_4$, $ZrCp_2Me_2$, $Zr(tBuCp)_2Me_2$, and $Zr(NiPr_2)_4$. In one example, the hafnium and zirconium precursors may have the same ligands (e.g., HTB and ZTB), thereby preventing any possible detrimental ligand exchange between the precursors Embodiments of the invention may utilize one or more of a wide variety of different elements selected from Group II, Group III, Group XIII, and rare earth metals of the Periodic Table. The elements may be provided using any precursor gases that have sufficient reactivity, thermal stability, and volatility. The precursor gases may be delivered to the process chamber using bubbling or DLI methods described above for hafnium and zirconium precursors.

Embodiments of the inventions may utilize a wide variety of different rare earth precursors. For example, many rare earth precursors have the formula:

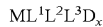

$ML^1L^2L^3D_x$ where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butyla-midinate. Examples of β-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethyl-ether, 1,2-dimethoxyethane, diglyme, triglyme, tetraglyme, 12-Crown-6,10-Crown-4, pyridine, N-methylpyrrolidine, triethylamine, trimethylamine, acetonitrile, and 2,2-dimethyl-propionitrile.

Representative examples of rare earth precursors include:
Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: Yb(N(SiMe$_3$)$_2$)$_3$, Yb(N(iPr)$_2$)$_3$, ((iPr)Cp)$_3$Yb, Cp$_3$Yb, Yb(THD)$_3$, Yb[OOCCH(C$_2$H$_5$)C$_4$H$_9$]$_3$, Yb(O(iPr))$_3$, Yb(acac)$_3$, (C$_5$Me$_5$)$_2$Yb, Yb(hfac)$_3$, and Yb(FOD)$_3$.

Lu precursors: Lu(N(SiMe$_3$)$_2$)$_3$, ((iPr)Cp)$_3$Lu, Cp$_3$Lu, Lu(THD)$_3$, Lu[OOCCH(C$_2$H$_5$)C$_4$H$_9$]$_3$, Lu(O(iPr))$_3$, and Lu(acac)$_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8-heptafluoro-2,2-dimethyl-3,5-octanedionate.

Still referring to FIG. 3A, the oxygen-containing gas supply system 46 is configured to introduce an oxygen-containing gas to the process chamber 10. The oxygen-containing gas can include, but is not limited to, O$_2$, water (H$_2$O), or peroxide (H$_2$O$_2$), or a combination thereof, and optionally an inert gas such as Ar. Similarly, the nitrogen-containing gas supply system 48 is configured to introduce a nitrogen-containing gas to the process chamber 10. Examples of nitrogen-containing gases include, but are not limited to, ammonia (NH$_3$), hydrazine (N$_2$H$_4$), and C$_1$-C$_{10}$ alkylhydrazine compounds. Common C$_1$ and C$_2$ alkylhydrazine compounds include monomethyl-hydrazine (MeNHNH$_2$), 1,1-dimethyl-hydrazine (Me$_2$NNH$_2$), and 1,2-dimethyl-hydrazine (MeNHNHMe). According to one embodiment of the invention, an oxygen- and nitrogen-containing gas may be utilized, for example, NO, NO$_2$, or N$_2$O, or a combination thereof, and optionally an inert gas such as Ar.

Embodiments of the inventions may utilize a wide variety of different Group II (alkaline earth) precursors. For example, many Group II precursors have the formula:

ML$^1$L$^2$D$_x$ where M is an alkaline earth metal element selected from the group of beryllium (Be), magnesium (Mg), calcium (Ca), strontium (Sr), and barium (Ba). L$^1$ and L$^2$ are individual anionic ligands, and D is a neutral donor ligand where x can be 0, 1, 2, or 3. Each L$^1$, L$^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6,10-Crown-4, pyridine, N-methylpyrrolidine, triethylamine, trimethylamine, acetonitrile, and 2,2-dimethylpropionitrile.

Representative examples of Group II (alkaline earth) precursors include:

Be precursors: Be(N(SiMe$_3$)$_2$)$_2$, Be(TMPD)$_2$, and BeEt$_2$.

Mg precursors: Mg(N(SiMe$_3$)$_2$)$_2$, Mg(TMPD)$_2$, Mg(PrCp)$_2$, Mg(EtCp)$_2$, and MgCp$_2$.

Ca precursors: Ca(N(SiMe$_3$)$_2$)$_2$, Ca(iPr$_4$ Cp)$_2$, and Ca(Me$_5$ Cp)$_2$.

Sr precursors: Bis(tert-butylacetamidinato)strontium (TBAASr), Sr(N(SiMe$_3$)$_2$)$_2$, Sr(THD)$_2$, Sr(THD)$_2$(tetraglyme), Sr(iPr$_4$ Cp)$_2$, Sr(iPr$_3$ Cp)$_2$, and Sr(Me$_5$ Cp)$_2$.

Ba precursors: Bis(tert-butylacetamidinato)barium (TBAABa), Ba(N(SiMe$_3$)$_2$)$_2$, Ba(THD)$_2$, Ba(THD)$_2$(tetraglyme), Ba(iPr$_4$ Cp)$_2$, Ba(Me$_5$ Cp)$_2$, and Ba(nPrMe$_4$ Cp)$_2$.

Embodiments of the inventions may utilize a wide variety of different precursors for Group XIII high-k forming elements (B, Al, Ga, In, Tl) into the hafnium zirconium based films. For example, many Al precursors have the formula:

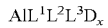

AlL$^1$L$^2$L$^3$D$_x$ where L$^1$, L$^2$, L$^3$ are individual anionic ligands, and D is a neutral donor ligand where x can be 0, 1, or 2. Each L$^1$, L$^2$, L$^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Other examples of Al precursors include: Al$_2$Me$_6$, Al$_2$Et$_6$, [Al(O(sBu))$_3$]$_4$, Al(CH$_3$COCHCOCH$_3$)$_3$, AlBr$_3$, AlI$_3$, Al(O(iPr))$_3$, [Al(NMe$_2$)$_3$]$_2$, Al(iBU)$_2$Cl$_5$Al(iBu)$_3$, Al(iBu)$_2$H, AlEt$_2$Cl, Et$_3$Al$_2$(O(sBu))$_3$, and Al(THD)$_3$.

Examples of Ga precursors include GaCl$_3$ and GaH$_3$, examples of 1n precursors include InCl$_3$ and InH$_3$, and examples of B precursors include borane (BH$_3$), diborane (B$_2$H$_6$), tri-ethylboron (BEt$_3$), triphenylboron (BPh$_3$), and borane adducts such as Me$_3$N:BH$_3$, and BCl$_3$.

Embodiments of the invention may utilize a wide variety of silicon precursors for incorporating silicon into the films or layers. Examples of silicon precursors include, but are not limited to, silane (SiH$_4$), disilane (Si$_2$H$_6$), monochlorosilane (SiClH$_3$), dichlorosilane (SiH$_2$Cl$_2$), trichlorosilane (SiHCl$_3$), hexachlorodisilane (Si$_2$Cl$_6$), diethylsilane (Et$_2$SiH$_2$), and alkylaminosilane compounds. Examples of alkylaminosilane compounds include, but are not limited to, di-isopropylaminosilane (H$_3$Si(NPr$_2$)), bis(tert-butylamino)silane ((C$_4$H$_9$(H)N)$_2$SiH$_2$), tetrakis(dimethylamino)silane (Si(NMe$_2$)$_4$), tetrakis(ethylmethylamino)silane (Si(NEtMe)$_4$), tetrakis(diethylamino)silane (Si(NEt$_2$)$_4$), tris(dimethylamino)silane (HSi(NMe$_2$)$_3$), tris(ethylmethylamino)silane (HSi(NEtMe)$_3$), tris(diethylamino)silane (HSi(NEt$_2$)$_3$), and tris(dimethylhydrazino)silane (HSi(N(H)NMe$_2$)$_3$), bis(diethylamino)silane (H$_2$Si(NEt$_2$)$_2$), bis(di-isopropylamino)silane (H$_2$Si(NPr$_2$)$_2$), tris(isopropylamino)silane (HSi(NPr$_2$)$_3$), and (di-isopropylamino)silane (H$_3$Si(NPr$_2$).

Still referring to FIG. 3A, the purge gas supply system 44 is configured to introduce a purge gas to process chamber 10. For example, the introduction of purge gas may occur between introduction of pulses of first and second precursors and an oxygen-containing gas, a nitrogen-containing gas, an oxygen- and a nitrogen-containing gas, or a high-k forming gas to the process chamber 10. The purge gas can contain an inert gas, such as a noble gas (i.e., He, Ne, Ar, Kr, Xe), nitrogen ($N_2$), or hydrogen ($H_2$).

Furthermore, processing system 1 includes substrate temperature control system 60 coupled to the substrate holder 20 and configured to elevate and control the temperature of substrate 100. Substrate temperature control system 60 contains temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular dielectric material on the surface of a given substrate.

In order to improve the thermal transfer between substrate 100 and substrate holder 20, substrate holder 20 can include a mechanical clamping system, or an electrical clamping system, such as an electrostatic clamping system, to affix substrate 100 to an upper surface of substrate holder 20. Furthermore, substrate holder 20 can further include a substrate backside gas delivery system configured to introduce gas to the back-side of substrate 100 in order to improve the gas-gap thermal conductance between substrate 100 and substrate holder 20. Such a system can be utilized when temperature control of the substrate is required at elevated or reduced temperatures. For example, the substrate backside gas system can contain a two-zone gas distribution system, wherein the helium gas gap pressure can be independently varied between the center and the edge of substrate 100.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 100, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the high-k materials.

The first precursor supply system 40, second precursor supply system 42, purge gas supply system 44, oxygen-containing gas supply system 46, the nitrogen-containing gas supply system 48, and auxiliary gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for precursor gases can be between 0.3 and 3 sec, for example 1 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Still referring to FIG. 3A, controller 70 can contain a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, first precursor supply system 40, second precursor supply system 42, purge gas supply system 44, oxygen-containing gas supply system 46, nitrogen-containing gas supply system 48, auxiliary gas supply system 50, substrate temperature control system 60, substrate temperature control system 60, and pressure control system 32. For example, a program stored in the memory may be utilized to activate the inputs to the aforementioned components of the processing system 1 according to a process recipe in order to perform a deposition process.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

Figure 3B:
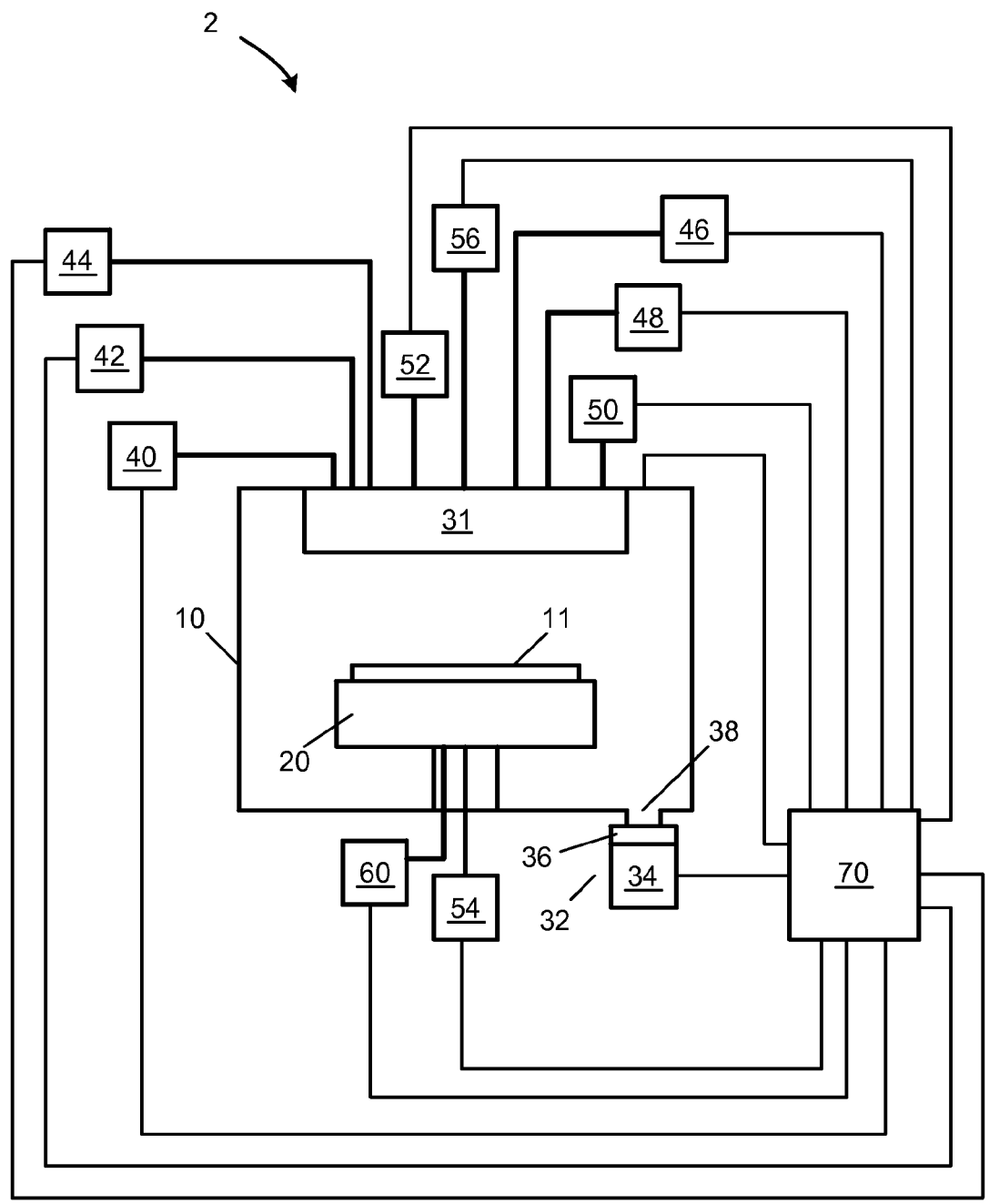

FIG. 3B illustrates a plasma processing system 2 that may be utilized for depositing one or more of the films and layers described above, including the high-k film 104, the cap layer 106, and the second cap layer 118 according to one embodiment of the invention. The plasma processing system 2 may be configured for performing PEALD or PECVD processing, in addition being able to perform ALD or CVD processing. The plasma processing system 2 is similar to the processing system 1 described in FIG. 3A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing $N_2$, $NH_3$, or $N_2H_4$, or $C_1$-$C_{10}$ alkylhydrazine compounds, or a combination thereof.

Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the entire content of which is incorporated herein by reference.

According to one embodiment of the invention, the plasma processing system 2 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 100. The substrate power source 54 may include a RF generator and an impedance match network, and may further include an electrode through which RF power is coupled to substrate 100. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 3B as separate entities, they may indeed contain one or more power sources coupled to substrate holder 20.

In addition, the plasma processing system 2 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 100. The remote plasma system 56 can, for example, contain a microwave frequency generator. The process chamber pressure can be between about 0.1 Torr and about 10 Ton, or between about 0.2 Torr and about 3 Torr.

A plurality of embodiments for a semiconductor device and a method for forming NMOS and PMOS transistors has been described. The method reduces the thickness or eliminates an interface layer and forms a high-k film diffused with chemical elements that shift the threshold voltage that is appropriate for the NMOS and PMOS device regions. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate unless otherwise specified.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
    providing a substrate defined with a NMOS device region and a PMOS device region, and an interface layer on the NMOS device region and the PMOS device region,
    depositing a high dielectric constant (high-k) film on the interface layer;
    depositing a first cap layer on the high-k film, wherein the first cap layer contains a first chemical element for modifying the high-k film in the NMOS device region;
    removing the first cap layer from the high-k film in the PMOS device region;
    depositing a second cap layer on the first cap layer in the NMOS device region and on the high-k film in the PMOS device region, wherein the second cap layer contains a second chemical element for scavenging oxygen from the interface layer;
    performing a heat-treating process to diffuse the first chemical element into the high-k film in the NMOS device region, and to reduce or eliminate the interface layer by oxygen diffusion from the interface layer through the high-k film into the second cap layer;
    removing the first cap layer and the second cap layer from the high-k film; and
    depositing a gate electrode film over the high-k film.

2. The method of claim 1, wherein the first cap layer includes a dielectric material and the first chemical element is selected from Mg, Ca Sr, Ba, Sc, Y, La, Ce, Pr, Nd, Pm, Sm, Eu, Gd, Tb, Dy, Ho, Er, Tm, Yb, or Lu, or a combination thereof.

3. The method of claim 2, wherein the dielectric material contains a metal oxide, a metal nitride, or a metal oxynitride, or a combination thereof.

4. The method of claim 1, wherein the second cap layer includes a metal layer and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

5. The method of claim 1, wherein performing the heat-treating process diffuses the second chemical element into the high-k film in the PMOS device region.

6. The method of claim 1, wherein the high-k film contains Hf, Zr, or both Hf and Zr.

7. The method of claim 1, wherein the gate electrode film contains W, WN, WSi$_x$, Al, Mo, Ta, TaN, TaSiN, HfN, HfSiN, Ti, TiN, TiSiN, Mo, MoN, Re, Pt, Ru, or Si.

8. The method of claim 1, wherein the substrate includes Si and the PMOS device region contains SiGe.

9. The method of claim 1, wherein the NMOS and PMOS device regions are separated by a shallow trench isolation (STI).

10. The method of claim 1, wherein the interface layer includes SiO$_2$.

11. A method of forming a semiconductor device, comprising:
    providing a substrate defined with a NMOS device region and a PMOS device region, and an interface layer on the NMOS device region and the PMOS device region;
    depositing a high dielectric constant (high-k) film on the interface layer;
    depositing a first cap layer on the high-k film, wherein the first cap layer contains a first chemical element for scavenging oxygen from the interface layer;
    removing the first cap layer from the high-k film in the NMOS device region;
    depositing a second cap layer on the first cap layer in the PMOS device region and on the high-k film in the NMOS device region, wherein the second cap layer contains a second chemical element for modifying the high-k film in the NMOS device region;
    performing a heat-treating process to diffuse the second chemical element into the high-k film in the NMOS device region and to reduce or eliminate the interface layer by oxygen diffusion from the interface layer through the high-k film into the second cap layer;
    removing the first cap layer and the second cap layer from the high-k film; and
    depositing a gate electrode film over the high-k film.

12. The method of claim 11, wherein the first cap includes a metal layer and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

13. The method of claim 11, wherein the second cap layer includes a dielectric material and the first chemical element is selected from Mg, Ca Sr, Ba, Sc, Y, La, Ce, Pr, Nd, Pm, Sm, Eu, Gd, Tb, Dy, Ho, Er, Tm, Yb, or Lu, or a combination thereof.

14. The method of claim 12, wherein the dielectric material contains a metal oxide, a metal nitride, or a metal oxynitride, or a combination thereof.

15. The method of claim 11, wherein performing the heat-treating process diffuses the first chemical element into the high-k film in the PMOS device region.

16. The method of claim 11, wherein the high-k film contains hafnium Hf, Zr, or both Hf and Zr.

17. The method of claim 11, wherein the gate electrode contains W, WN, WSi$_x$, Al, Mo, Ta, TaN, TaSiN, HfN, HfSiN, Ti, TiN, TiSiN, Mo, MoN, Re, Pt, Ru, or Si.

18. The method of claim 11, wherein the substrate includes Si and the PMOS device region contains SiGe.

19. The method of claim 11, wherein the NMOS and PMOS device regions are separated by a shallow trench isolation (STI).

20. The method of claim 11, wherein the interface layer includes SiO$_2$.

* * * * *